United States Patent
Zeidler et al.

(10) Patent No.: US 8,759,760 B2
(45) Date of Patent: Jun. 24, 2014

(54) INSPECTION SYSTEM

(75) Inventors: Dirk Zeidler, Oberkochen (DE); Ulrike Zeile, Heidenheim (DE)

(73) Assignee: Carl Zeiss Microscopy GmbH, Jena (DE)

( * ) Notice: Subject to any disclaimer, the term of this patent is extended or adjusted under 35 U.S.C. 154(b) by 40 days.

(21) Appl. No.: 13/050,035

(22) Filed: Mar. 17, 2011

(65) Prior Publication Data

US 2011/0226949 A1    Sep. 22, 2011

(30) Foreign Application Priority Data

Mar. 18, 2010 (DE) .......................... 10 2010 011 898

(51) Int. Cl.
*G01N 23/00* (2006.01)

(52) U.S. Cl.
USPC ............................. 250/306; 250/310; 250/307

(58) Field of Classification Search
None
See application file for complete search history.

(56) References Cited

U.S. PATENT DOCUMENTS

| | | | |
|---|---|---|---|
| 2,944,172 A | 7/1960 | Opitz et al. | |
| 4,440,475 A | 4/1984 | Colliaux | |
| 5,146,089 A | 9/1992 | Rosien | |
| 5,780,859 A * | 7/1998 | Feuerbaum et al. | 250/396 R |
| 6,855,938 B2 | 2/2005 | Preikszas et al. | |
| 6,960,766 B2 * | 11/2005 | Chen | 850/1 |
| 7,045,791 B2 | 5/2006 | Benas-Sayag et al. | |
| 7,297,948 B2 * | 11/2007 | Benas-Sayag et al. | 250/306 |
| 7,573,050 B2 | 8/2009 | Benas-Sayag et al. | |
| 2004/0084629 A1 * | 5/2004 | Preikszas et al. | 250/396 R |
| 2005/0184251 A1 | 8/2005 | Oi et al. | |
| 2005/0221229 A1 * | 10/2005 | Nasser-Ghodsi et al. | 430/296 |
| 2008/0315093 A1 * | 12/2008 | Hasegawa et al. | 250/310 |
| 2009/0309025 A1 | 12/2009 | Preikszas | |

FOREIGN PATENT DOCUMENTS

| | | | |
|---|---|---|---|
| DE | 1119428 | 12/1961 | |
| DE | 10 2006 059 162 A1 | 6/2008 | |
| EP | 1 1724 809 A1 | 11/2006 | |
| JP | 11 265675 A | 9/1999 | |
| JP | 11265675 A * | 9/1999 | H01J 37/22 |
| JP | 2007094079 A * | 4/2007 | |

OTHER PUBLICATIONS

I. M. C. Vogels et al., "Rapid combined light and electron microscopy on large frozen biological samples", Journal of Microscopy, vol. 235, Pt 3 2009, pp. 252-258.

(Continued)

*Primary Examiner* — Andrew Smyth
(74) *Attorney, Agent, or Firm* — Bruce D Riter

(57) ABSTRACT

A combined inspection system for inspecting an object disposable in an object plane 19, comprises a particle-optical system, which provides a particle-optical beam path 3, and a light-optical system, which provides a light-optical beam path 5; and a controller 60, wherein the light-optical system comprises at least one light-optical lens 30 arranged in the light-optical beam, which comprises a first lens surface facing the object plane which has two lens surfaces 34, 35 and a through hole 32, wherein the particle-optical system comprises a beam deflection device 23, in order to scan a primary particle beam 15 over a part of the sample plane 19, and wherein the controller is configured to control the beam deflection device 23 in such a manner that a deflected primary particle beam 15 intersects an optical axis 3 of the particle-optical beam path in a plane which is arranged inside the through hole.

28 Claims, 3 Drawing Sheets

(56) References Cited

OTHER PUBLICATIONS

J. M. Robinson et al., "Correlative fluorescence and electron microscopy in tissues: immunocytochemistry", Journal of Microscopy, vol. 235, Pt 3 2009, pp. 259-272.

K. L. McDonald, "A review of high-pressure freezing preparation techniques for correlative light and electron microscopy of the same cells and tissues", Journal of Microscopy, vol. 235, Pt 3 2009, pp. 273-281.

K. A. Jahn et al., "Correlative fluorescence and transmission electron microscopy: an elegant tool to study the actin cytoskeleton of whole-mount (breast) cancer cells", Journal of Microscopy, vol. 235, Pt 3 2009, pp. 282-292.

L. H. P. Hekking et al., "Focused ion beam-scanning electron microscope: exploring large volumes of atherosclerotic tissue", Journal of Microscopy, vol. 235, Pt 3 2009, pp. 336-347.

Office action in German patent application No. 10 2010 011 898.2 of Oct. 29, 2010 (German-language, with English-language machine translation).

Muna A. Al-Khashab et al., "Design and Fabrication of the Single Polepiece Magnetic Electron Lens of Truncated Cone Polepiece Shape," Al-Rafidain Engineering, vol. 19, No. 3, Jun. 2011, pp. 49-54.

* cited by examiner

INSPECTION SYSTEM

CROSS-REFERENCES TO RELATED APPLICATIONS

The present application claims priority of Patent Application No. 10 2010 011 898.2, filed Mar. 18, 2010 in Germany, entitled "Inspection System," the content of which is hereby incorporated by reference in its entirety.

FIELD

The invention relates to an inspection system which combines a particle-optical inspection system and a light-optical inspection system. In particular the inspection system combines a particle-optical microscope, such as for example an electron microscope, with a light microscope.

BACKGROUND

It is desirable to inspect samples with alternative examination methods. This can be achieved by first inspecting the sample with one specialized inspection tool and method and subsequently inspecting the sample with another, alternative specialized inspection tool and method. For example, the sample is first inspected using an electron microscope and then the same sample is inspected using a light microscope, wherein inspection results, such as, for example, an electron-microscopic image and a light-optical image, are correlated with each other. Inspection of mutually corresponding regions of the sample with both methods requires a correct positioning of the sample in the respective inspection systems. This can be time-consuming and error-prone.

SUMMARY

It is an object of the present invention to provide inspection systems allowing to inspect a sample using alternative inspection methods.

The present invention has been accomplished taking the above problems into consideration.

Embodiments of the invention provide a combined inspection system which combines a particle-optical inspection system and a light optical inspection system allowing to inspect a sample located at a sample plane of the combined inspection system both by particle-optical methods and light-optical methods.

According to embodiments a combined inspection system includes a particle-optical system which provides a particle-optical beam path, and a light-optical system which provides a light-optical beam path, wherein the light-optical system includes at least one light-optical lens arranged in the light-optical beam path, wherein the light-optical lens has a through-hole traversed by the particle-optical beam path.

The light-optical lens is arranged in the light-optical beam path and affects the light-optical beam path due to optical properties, such as a refractive power, which the lens provides. Such optical properties of the lens are defined, for example, by shapes of interfaces between lens elements of the lens and refractive indices of the lens elements. The light-optical lens is also geometrically arranged within the particle-optical beam path which traverses the light-optical lens through its through-hole.

A diameter of the through-hole is dimensioned to be large enough that the particle-optical beam path of the inspection system is only curtailed by a tolerable amount, and it is dimensioned to be small enough that an imaging performance of the light-optical lens is reduced by the presence of the through hole only by a tolerable amount. Using the light-optical lens having the through hole, it is possible to functionally superimpose the light-optical beam path and the particle-optical beam path. With such arrangement it is in particular possible to direct primary particles onto a sample via the particle-optical beam path and/or to direct secondary particles away from the sample, and to direct illumination light onto the sample via the light-optical beam path and/or to direct measuring light away from the sample for a subsequent analysis.

According to exemplary embodiments, the light-optical lens has a positive refractive power.

According to further exemplary embodiments, the light-optical lens carries a coating on at least one lens surface, wherein the coating is sufficiently transparent for the light used in the optical beam path and which has an sufficient electrical conductivity to avoid electrical charging the surface. Such charging of lens surfaces could impede the particle-optical inspection of the sample using charged particles.

According to embodiments herein, an inner wall of the through-hole of the light-optical lens carries an electrically conductive coating. Such coating may prevent electrical charging of the inner wall during the operation of the particle-optical system. For example, the electrically conductive coating may have a conductivity such that an electrical resistance between two lens surfaces of the light-optical lens is less than 10 M$\Omega$, in particular less than 1 M$\Omega$, and in particular less than 100 k$\Omega$.

According to embodiments, the particles used in the particle-optical inspection system can be electrons or ions. According to further embodiments, the light used for inspection in the light-optical beam path can be light, i.e. electromagnetic radiation, of any wavelength, which is generated by a broadband light source or a narrow-band light source, such as, for example, a laser. The wavelengths of the light can be within the visible spectral range or outside of the visible spectral range, such as in the infrared spectral range or in the ultraviolet spectral range.

According to embodiments, the combined inspection system includes a light-optical mirror in order to separate the light-optical beam path which is superimposed with the particle-optical beam path in the region of the light-optical lens. The light-optical mirror may include an aperture traversed by the particle-optical beam path, and a reflecting surface deflecting the light-optical beam path such that an optical axis of the light-optical beam path before incidence on the mirror extends transverse to an optical axis of the light-optical beam path after reflection from the mirror. According to exemplary embodiments, the light-optical mirror is a flat mirror having a light-reflecting surface extending in a plane. According to further exemplary embodiments, a light-reflecting surface of the mirror is provided by a metal which is electrically conductive in order to avoid charging of the mirror by charged particles used in the particle-optical inspection system.

According to embodiments, the light-optical lens comprises plural lens elements which can be spaced apart from one another or which can abut one another and which can be formed as cemented lens elements. The plural lens elements can be manufactured from various materials that differ with regard to their refractive index and/or their Abbe number. With such arrangement it can be possible to reduce chromatic errors in the light-optical beam path.

According to embodiments, the particle-optical inspection system comprises at least one particle-optical lens having refractive power arranged in the particle-optical beam path. The particle-optical lens may comprise a magnetic lens which provides a focusing power by a magnetic field, the particle-optical lens may comprise an electrostatic lens which provides a focusing power by an electric field, or the particle-optical lens may comprise a combination of a magnetic lens and an electrostatic lens which provides its focusing power by superimposed magnetic and electric fields.

According to exemplary embodiments, the particle-optical lens comprises a magnetic lens which includes a first pole piece having a central bore. In this arrangement the light-optical lens may be supported by the first pole piece.

According to an embodiment herein, the magnetic lens includes a second pole piece having a central bore arranged at a smaller distance from the sample plane than the central bore of the first pole piece. The magnetic fields generated between the two pole pieces provide the focusing power of the particle-optical lens.

According to exemplary embodiments, a main plane of a particle-optical lens is arranged closer to the sample plane than a main plane of the light-optical lens. According to an embodiment herein, the inspection system comprises a controller for energizing the particle-optical lens such that its back focal plane is arranged within the light-optical lens and/or such that its back focal plane is arranged near to a main plane of the light-optical lens. In such configuration, a distance between the back focal plane of the particle-optical lens and the main plane of the light-optical lens can be, for example, be less than 0.4 times, in particular 0.2 times, and in particular 0.1 times a focal length of the particle-optical lens. This may result in an advantage such that the deflected particle beam, which intersects the optical axis of the particle-optical beam path near the back focal plane of the particle-optical lens, extends substantially parallel to the non-deflected particle beam and is orthogonally incident on the sample plane.

According to further exemplary embodiments, a main plane of the light-optical lens is arranged near to a main plane of the particle-optical lens. In this arrangement, a distance between the main plane of the particle-optical lens and the main plane of the light-optical lens can be, for example, less than 0.4 times, in particular 0.2 times, and in particular 0.1 times the focal length of the particle-optical lens. With such configuration it is possible to achieve an advantage in that the deflected particle beam which is focused on the sample plane experiences relatively small aberrations caused by the particle-optical lens. In particular, a focusing of the particle beam may show a reduced deterioration caused by coma.

According to embodiments, the particle-optical inspection system comprises a beam deflection device configured to scan a primary particle beam over a portion of a sample plane. The beam deflection device may comprise a single beam deflector or plural beam deflectors arranged in the particle-optical beam path adjacent to one another. The beam deflection device may also comprise a controller configured to energize the one or more beam deflectors. The beam deflector can be a magnetic beam deflector providing a magnetic field deflecting the primary particle beam, or an electrostatic beam deflector providing a deflecting electric field.

The beam deflector can be configured in such a manner that a deflecting field, in particular the deflecting magnetic field, is generated inside the through hole provided in the light-optical lens or upstream or downstream of the through hole of the light-optical lens. With such arrangement it is in particular possible to maintain a small diameter of the through hole.

According to a further exemplary embodiment, the inspection system comprises a controller which is configured to control a beam deflection device for scanning a particle beam over an sample plane, such that a deflected particle beam intersects an optical axis of the particle-optical beam path in a plane which is at a distance from both a lens surface facing towards the object plane and from a lens surface of the light-optical lens facing away from the object plane, which is smaller than 2.0 times, in particular 1.0 times, the distance between the two lens surfaces. In particular the deflected particle beam can intersect the optical axis of the particle-optical beam path within the light-optical lens. In this configuration it is possible to design the through hole in the light-optical lens with a small diameter.

According to a further exemplary embodiment, the beam deflection device comprises two beam deflectors which are arranged in the particle-optical beam path in upstream of the through hole of the light-optical lens and which can be energized by the controller such that the primary particle beam is deflected away from the optical axis of the particle-optical beam path by the first beam deflector and is deflected by the second beam deflector towards the optical axis such that it intersects the optical axis within or close to the through hole of the light-optical lens. A distance between a point of intersection of the primary particle beam with the optical axis of the particle-optical beam path and a center of the through-hole can be in particular smaller than a thickness or smaller than half the thickness of the light-optical lens. Such configuration allows to maintain a diameter of the through hole relatively small while still being able to scan the primary particle beam over a relatively large portion of the sample plane.

According to certain embodiments, the light-optical inspection system comprises a detector which is arranged in the light-optical beam path extending from the sample plane downstream of the light-optical lens and in particular also downstream of a folding mirror, in order to direct light emerging from the sample plane through the light-optical lens onto the detector.

An object arranged at the sample plane can be transparent to the light that is used, so that an illumination light-beam can be directed from one side of the sample plane lying opposite to the light-optical lens with respect to the sample plane onto the sample, in order to achieve a transmitted light illumination. Alternatively, an incident illumination can be achieved by an illumination light beam being directed through the light-optical lens onto the sample plane.

The illumination light beam can be generated by a broadband light source, such as a halogen lamp or a xenon lamp, or by a narrow-band light source, such as a laser, for example.

According to certain embodiments, the light-optical beam path can be configured such that an extended area of the sample plane is imaged onto a spatially resolving image sensor. It is then possible to directly capture a light-microscopic image of the object arranged at the sample plane with the image sensor.

According to certain embodiments, the illumination light beam, in particular a laser beam, is focused onto the sample plane, the focused beam is scanned over the sample plane and illumination light scattered at the object is recorded as a function of the location to which the illumination light beam is directed in the sample plane, in order to obtain the light-microscopic image of the object according to a method which is conventionally referred to as Laser Scanning Microscopy. In this method, the detector arranged in the light-optical beam path can be a detector which is not spatially resolving and sufficient to measure an intensity of scattered light induced by the illumination beam.

According to exemplary embodiments, it is possible, using the combined inspection system, to carry out a cathode luminescence method, by using a primary particle beam directed to the object to generate electromagnetic radiation in the object which is directed to the detector using the light-optical beam path.

According to certain embodiments, it is possible, using the combined inspection system, to carry out time-resolved measurements, if a primary particle beam directed onto the sample plane or an illumination light beam directed onto the sample plane or both the primary particle beam as well as the illumination light beam are pulsed beams. In exemplary embodiments herein, it is possible to use a pulse of the primary particle beam to excite processes at the object and to measure these excited processes using a subsequent pulse of the illumination light beam, wherein a time difference between the excitation pulse and the measurement pulse is varied. Conversely it is also possible to excite processes with a pulse of the illumination light beam and to measure these excited processes with a subsequent pulse of the primary particle beam, wherein a time difference between the excitation pulse and the measurement pulse is varied.

According to certain further embodiments, the combined inspection system, provides a laser beam directed to the object via the light-optical beam path, to excite energy levels in the object with the laser and to detect radiation emitted during transitions between energy levels via the light-optical beam path. In this way, for example, Raman-spectroscopy can be carried out on the object.

According to still further embodiments, the object is manipulated with the illumination light beam and to monitor the manipulation of the object using the particle-optical system.

According to further embodiments, the combined inspection system, which provides the particle-optical beam path and the light-optical beam path within a first particle beam column, is integrated with a second particle beam column, which provides a second particle beam path. These two particle beam columns are arranged relative to each other in such a manner that their optical axes pass through a common working area, so that an object to be inspected or processed can be arranged in the working areas of both particle beam columns. Background information on systems comprising two particle beam columns with an overlapping working area can be obtained for example from US 2005/0184251 A1, U.S. Pat. No. 6,855,938 and US 2009/0309025 A1, the full disclosure of these documents is incorporated herein by reference. In such systems, one of two particle beam columns, such as, for example, the ion beam column or the electron beam column, can be configured as a combined inspection system in that a light-optical beam path is integrated with the particle beam column. It is then possible to process the object using both columns. The processing may include deposition of material on the object or removal of material from the object. Inspection of the object can be performed using the light-optical system. Further, with such system, the light-optical beam path can also be used to process the object, by directing a laser beam via the light-optical beam path towards the object in order to remove material from the object by the action of the laser beam.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
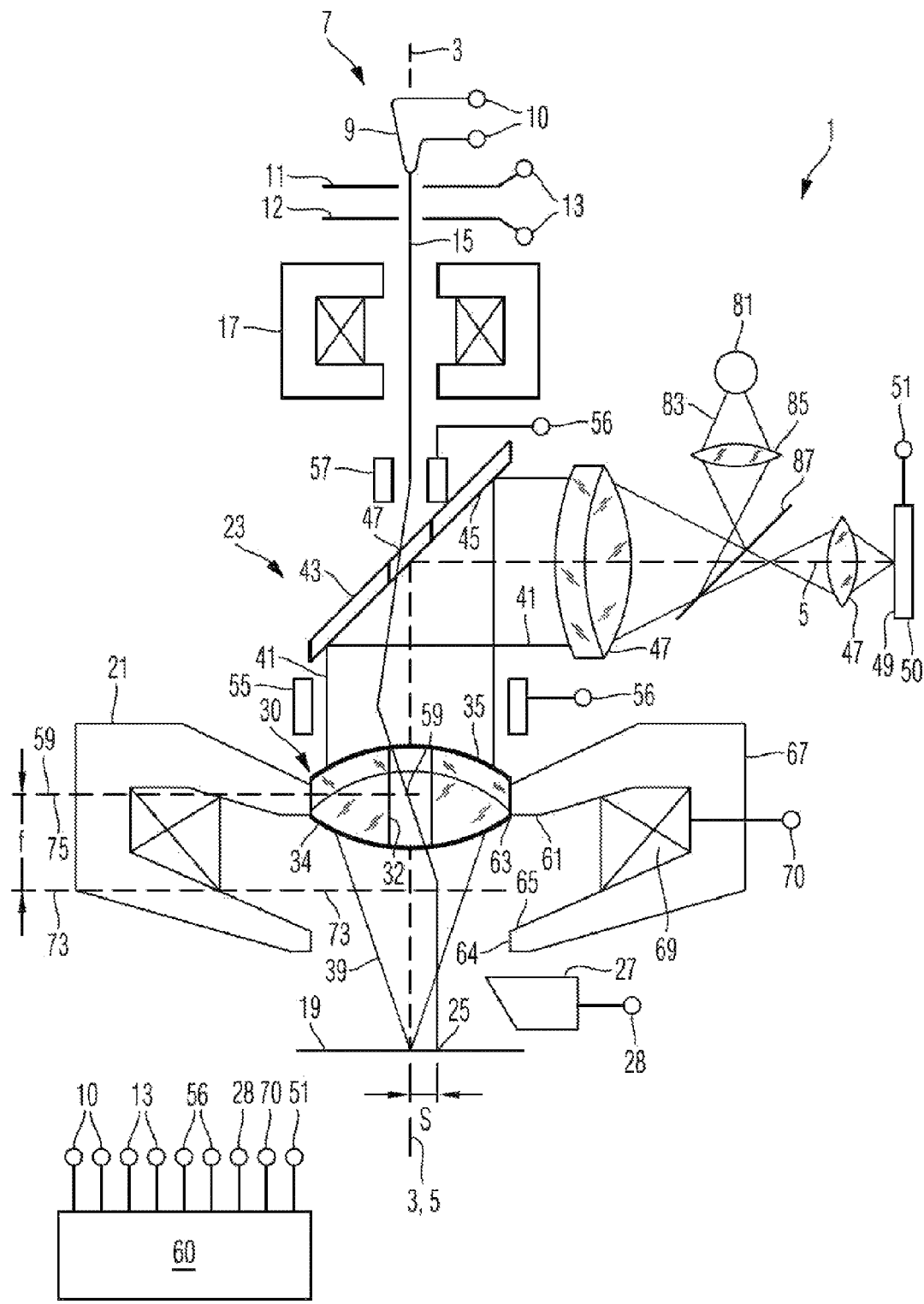
FIG. 1 is a schematic illustration of an embodiment of a combined inspection system.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 is a schematic illustration of an embodiment of a combined inspection system 1. The combined inspection system provides a particle-optical beam path having an optical axis 3 and a light-optical beam path having an optical axis 5, wherein the particle-optical beam path and the light-optical beam path are superimposed with each other within a portion of the beam paths, such that the optical axes 3 and 5 in this portion extend, for example, parallel to each other and at a small distance from each other, or they coincide with each other, and wherein the optical axes 3 and 5 outside of this portion extend at transverse to each other.

The particle-optical system comprises a particle source 7 which is an electron source in the illustrated example. The particle source comprises a cathode 9 having terminals 10 connected to a controller 60 of the system 1 controlling a heating current supplied to the cathode 9 and an electric potential of the cathode. The particle source further comprises a suppressor electrode 11 and an extractor electrode 12 having terminals 13 connected to the controller 60 which applies electric potentials to the electrodes 11, 12, in order to extract a particle beam 15 from the cathode 9 and to accelerate the particles of the beam to a desired kinetic energy.

In the illustrated example, a condenser lens 17 is arranged in the particle-optical beam path downstream of the particle source 7 in order to collimate the beam 15. However, other examples of the particle-optical system may not use a condenser lens.

A focusing particle-optical lens 21 is arranged in the particle-optical beam path between the particle source 7 and a sample plane 19. The focusing particle-optical lens 21 is configured to focus the particle beam 15 onto a sample located at the sample plane 19 to be inspected or processed.

The particle optical system further comprises a deflection device 23 described in further detail below and configured to deflect the particle beam 15 and to scan an a location 25 of incidence of the particle beam 15 over a region of the sample plane 19. In a situation shown in FIG. 1 the location of incidence 25 is spaced apart from the optical axis 3 by a scan deflection distance s.

In the illustrated example, an electron detector 27 is arranged next to the objective lens 21 and close to the sample plane 19, in order to detect particles released or back-scattered by the particle beam 15 from the inspected object. The controller 60, which also controls the deflection system 23, receives detection signals of the detector via a connector 28. The detection signals represent intensities of particles that are released from the sample by the particle beam 15. Scanning of the location of incidence 25 over the sample plane 19 and recording of the produced particle intensities allows to obtain a particle optical image of the scanned region of the sample plane 19.

In the illustrated example, the particle detector 27 is arranged between the objective lens 21 and the sample plane 19. It is, however, also possible to arrange the particle detector at other positions of the particle-optical system. For example, the particle detector can be arranged between the objective lens 21 and the particle source 7 close to the optical axis 3 of the particle-optical beam path in order to detect particles emerging from the sample plane 19 and having traversed the objective lens 21.

The light-optical system comprises a light-optical lens 30, which has a focusing power on light of a wavelengths used in the light-optical system. The lens 30 has a through hole 32 which traverses the lens 30 and is positioned such that the optical axis 3 of the particle-optical beam path passes through the through hole 32 in its longitudinal direction. The lens 30 is manufactured from a material which is transparent to light at the wavelengths used. Surfaces 34, 35 of the lens 30 are shaped such that the lens 30 can provide its light-refracting focusing power. In particular, one of the two surfaces 34, 35 or both of the surfaces can have a convex shape. The lens 30 may comprise one or more lens elements. In the example illustrated of FIG. 1, lens 30 comprises two lens elements that are cemented together. The two lens elements are manufactured from different materials, which differ with respect to their refractive index and their Abbe number, in order to reduce chromatic errors when the lens 30 is used in an imaging process.

The surfaces 34 and 35 of the lens 30 carry a coating which is transparent for the light of the wavelengths used and which is electrically conductive. An example of a suitable coating material is indium tin oxide (ITO). The function of the electrically conductive coating is to prevent electric charging of the lens 30 during the operation of the particle-optical system and any malfunction of the latter due to an electrical charges.

An inner wall of the through hole 32 is provided with an electrically conductive coating, in order to prevent electric charging of the inner wall by charged particles that are incident on the wall during the operation. The electrically conductive coating may have be of a high resistance, if it is desired to maintain the two lens surfaces 34, 35 at different electric potentials. Values for such a high resistance provided by the through hole between the two lens surfaces can be greater than or equal to 100 k$\Omega$, in particular greater than or equal to 1 M$\Omega$, in particular greater than or equal to 10 M$\Omega$, and the resistance may be from within a range from 100 k$\Omega$ to 10 M$\Omega$. If it is desired to maintain the two lens surfaces 34, 35 at a same electric potential, the resistance provided by the through hole between the two lens surfaces can be very low and may have values of less than 100 k$\Omega$, for example.

The lens 30 is arranged at a distance from the sample plane 19 such that a light beam 39 emitted from the sample plane 19 into a cone is transformed by the lens 30 into a parallel light beam 41 which is reflected at a mirror 43 positioned in the light-optical beam path downstream of the lens 30. The mirror 43 has a function to separate the light-optical beam path 5 from the particle-optical beam path 3 which are superimposed with each other between the sample plane 19 and the mirror 43. This is evident from FIG. 1 in that the main axis of the light beam 41, before it is incident on the mirror 43, is oriented transversely to the main axis of the light beam 41 after it is reflected at the mirror 43.

The mirror 43 has a flat mirror surface 45 which is provided by a metal plate or by a metal coating provided on a substrate. The mirror surface 45 made of metal prevents charging of the surface during the operation of the particle-optical system. The mirror 43 has a through hole 47 which is traversed by the optical axis 3 of the particle-optical system such that the mirror 43 does not substantially restrict the particle-optical beam path.

The light beam 41 reflected from the mirror 43 traverses optics comprising one or more lenses 47 which are configured such that a magnified image of a sample plane 19 is produced on a surface 49 of a spatially resolving detector 50. Images 50 recorded by the detector are light-microscopic images of a sample arranged in the sample plane 19. The images can be supplied to the controller 60 of the inspection system 1 via contact terminal 51 of the detector 50.

Using the inspection system 1, it is possible to obtain both a particle-microscopic image and a light-microscopic image of the sample arranged in the sample plane 19, wherein it is not necessary to move the object between obtaining the particle-microscopic image and obtaining the light-microscopic image. Therefore, after calibration of the particle-optical beam path and the light-optical beam path it is easily possible to correlate features of the particle-microscopic image with features of the light-microscopic image. Meaningful information about structures and properties of the sample can be derived from the particle-microscopic and the light-microscopic images.

The deflection device 23 comprises two deflectors 55 and 57 which are connected to controller 60 of the system 1 via contacts 56. In the illustrated example, the deflector 55 is, when seen in the longitudinal direction of the optical axis 3 of the particle-optical beam path, arranged between the light-optical lens 30 and the mirror 43, while the deflector 57 is arranged between the mirror 43 and the particle source 9. In the illustrated example, the deflectors 55, 57 are energized such that the particles of beam 15 traveling on the axis 3 between the source 7 and the deflector 57 are deflected away from the optical axis 3 by the deflector 57, while the deflector 55 deflects the particles of the beam 15 back towards the optical axis 3, such that they intersect the optical axis 3 in a plane 59. After traversing the optical axis 3 in the plane 59, the particles of the beam 15 move away from the optical axis 3 and are finally incident on the sample plane 19 at the location of incidence 25 at a distance s from the optical axis 3.

The deflectors 55 and 57 are energized by the controller 60 such that they can vary the distance s of the location of incidence 25 from the axis 3 in order to scan the location of incidence 25 over the sample plane 19. The deflection of the beam 15 is always performed such that the deflector 57 deflects the beam away from the axis 3 and that the deflector 55 deflects the beam towards the axis 3, wherein the plane 59 in the beam 15 intersects the optical axis 3 subsequent to the deflection by the deflector 55 is maintained stable in the direction of the particle-optical or the light-optical beam path. In the illustrated example, the position of the plane 59 coincides with a center of the through hole 32. The plane 59 is located inside the light-optical lens 30. When the particle beam is deflected to provide the scan deflection s, the beam is tilted about the point of intersection of the plane 59 and the optical axis 3. This allows for maintaining a small diameter of the through hole while achieving relatively large scan deflections.

In the example shown in FIG. 1, the plane 59 is arranged centrally between the two lens surfaces 34, 35. It is possible to deviate from this arrangement however, as long as a distance between the plane 59 and the lens surfaces 34, 35 is relatively small. For example, advantageous arrangements are those in which the plane 59 is no further away from either of the two lens surfaces 34, 35 than 2 times the distance between the two lens surfaces or the length of the through hole 32.

Other configurations of the deflection system are possible. For example, the deflector 57, the deflector 55 or both deflectors 55 and 57 can be arranged between the light-optical lens 30 and the sample plane 19. Moreover it is possible, in order to generate the scan deflection s, to use only one single deflector arranged between the light-optical lens 30 and the sample plane 19 or between the particle beam source 7 and the light-optical lens 30. In particular, the single deflector can be positioned between the light-optical lens and the mirror 43 or between the particle beam source 7 and the mirror 43.

In the illustrated example, the objective lens 21 is a magnetic lens, which comprises a first pole piece 61 having a central bore 63 and a second pole piece 65 arranged closer to the sample plane 19 than the first pole piece 61 and also having a central bore 64. The two annular pole pieces 61 and 65 are connected by a yoke 67 which provides a path for magnetic field lines. A current-carrying coil 69 is arranged inside the yoke. The coil 69 is connected to the controller 60 of the system 1 via contacts 70 and controlled by the controller 60 in order to generate a magnetic field between the pole pieces 61 and 65. The magnetic field provides a focusing power on the particle beam and focuses the beam in the sample plane 19 at the location of incidence 25. A main plane 73 of the magnetic objective lens 21 is, when seen in the direction of the optical axis 3, arranged between the two pole pieces 61, 65. The coil 69 is energized by the controller 60 such that a back focal plane 75 of the objective lens 21 is arranged at a distance f from the main plane 73 of the objective lens 21. The distance f is selected such that the back focal plane 75 of the objective lens 21 approximately coincides with the plane 59 in which the particle beam 15 traverses the optical axis 3. This results in the particle beam 15 being substantially orthogonally incident on the sample plane 19, regardless of the amount of the scan deflection s. Such configuration of the particle-optical beam path simplifies the correlation of features of the recorded particle-optical image with features of the recorded light-optical image.

In the illustrated example, the light-optical lens 30 is mounted on the first pole piece 61 which is more distant from the sample plane 19 than pole piece 64. The electrically conductive coating of the lens 30 can be connected to the pole piece 61. Therefore, a main plane 72 of the light-optical lens 30, which approximately coincides with the plane 59 in the illustrated example, is further away from the sample plane 19 than the main plane 73 of the particle-optical lens 21. Such relation between the main planes of the light-optical lens 30 and the particle-optical lens 21 can also be satisfied if the particle-optical lens 21 is an electrostatic lens rather than a magnetic lens.

According to other embodiments of the combined inspection system it is possible to arrange the main plane of the particle-optical lens closest to the sample plane 19 at a greater distance from the sample plane 19 than the main plane of the light-optical lens of the light-optical system arranged closest to sample plane 19.

The light-optical system further comprises a light source 81 emitting an illumination light beam 83 for illuminating the sample plane 19. The illumination light beam 83 is collimated by one or more light-optical lenses 85 and is superimposed with the light-optical beam path 5 for imaging the sample plane 19 on the detector 50 by a partially transparent mirror 87. As shown in FIG. 1, the illumination light beam 83 is incident on the sample plane 19 from above and provides an incident illumination. According to other embodiments, in particular for the inspection of thin or light-transparent samples, it is possible to direct an illumination light beam onto the sample plane 19 from below in the diagram of FIG. 1.

Figure 2:
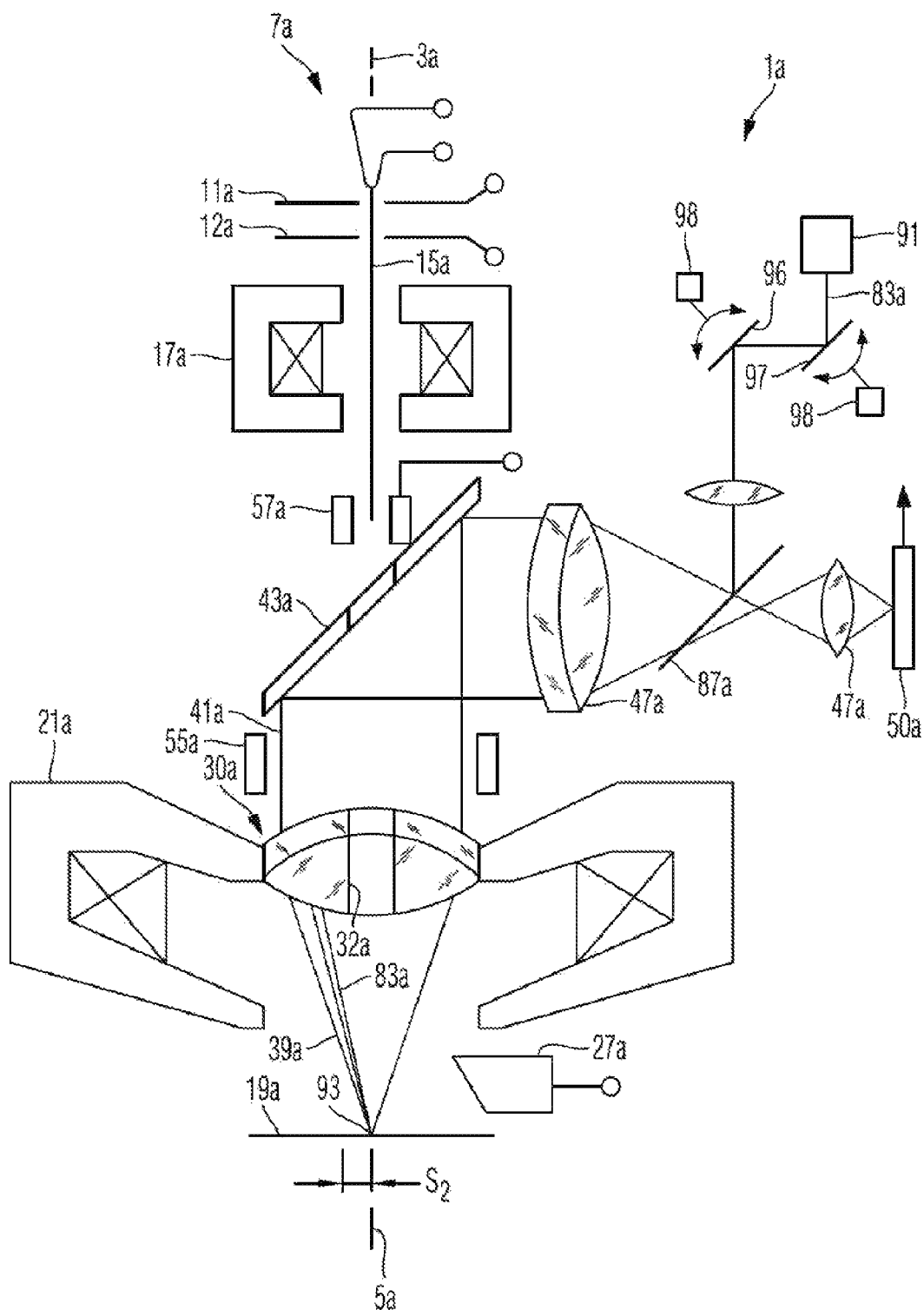
FIG. 2 is a schematic illustration of a further embodiment of a combined inspection system.

A combined inspection system 1a schematically illustrated in FIG. 2 has a configuration which is similar to that of the inspection system illustrated with reference to FIG. 1 above and which differs from that essentially by the fact that a laser 91 is used to generate an illumination light beam 83a which is focused onto a sample plane 19a at an incidence point 93 by a light-optical lens 30a. The incidence point 93 can be scanned over the sample plane 19a in order to achieve a scan deflection s2 of the incidence point 93 away from an optical axis 5a of a light-optical system. For this purpose, two scanning mirrors 96, 97 are arranged in the beam path of the illumination light beam 83a in upstream of a mirror 87a for superimposing the beam path of the illumination light beam 83a with a beam path for imaging the sample plane 19a onto a detector 50a. The scanning mirrors 96, 97 can be pivoted by actuators 98, in order to deflect the beam 83a in two mutually orthogonal spatial directions and to scan the incidence point 93 of the beam 83a over the sample plane 19a.

Illumination light 83a incident on an object arranged in the sample plane 19a at the point 93 is scattered by the object with a scattering intensity which is dependent on the material present at the incidence point 93 and its structure. Therefore, the scattered intensity is also dependent on the scan deflection s2. Scattered light 39a is converted by the light-optical lens 30a, in a way similar to that in the embodiment illustrated with reference to FIG. 1, into a parallel beam bundle 41a, which is directed onto the detector 50a in order to detect the intensity of this scattered light. The detector 50a is not a spatially resolving detector. It is therefore possible to record the intensities of the scattered light as a function of the scan deflection s2 and to obtain a corresponding light-microscopic image. The light-optical system in this arrangement is operated as a laser scanning microscope.

Figure 3:
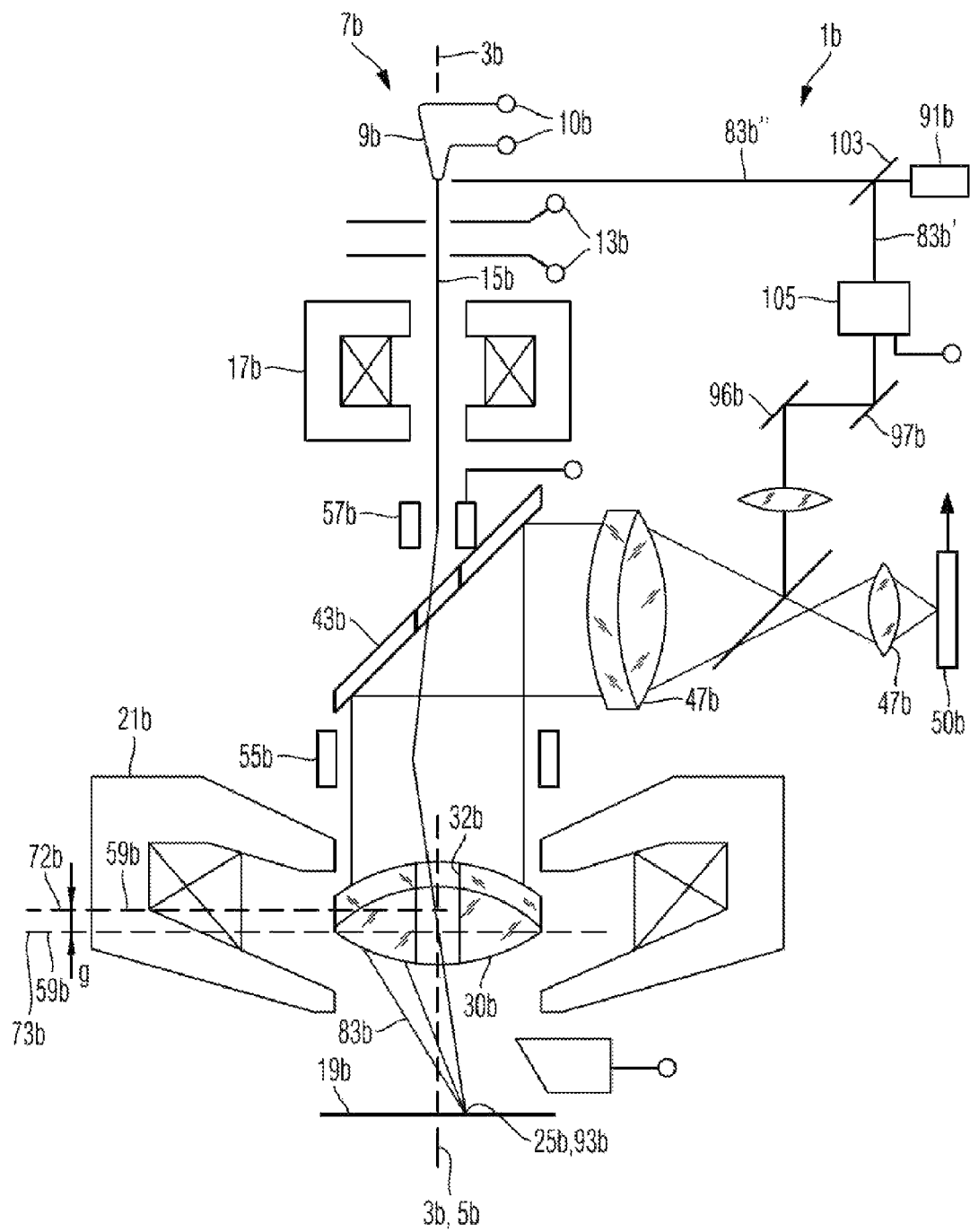
FIG. 3 is a schematic illustration of a still further embodiment of a combined inspection system.

FIG. 3 is a schematic illustration of another embodiment of a combined inspection system. The inspection system 1b of FIG. 3 has a largely similar structure to the inspection systems illustrated with reference to FIGS. 1 and 2 above. The inspection system 1b differs from the inspection system illustrated with reference to FIG. 2 essentially in that only a portion 83b' of a laser beam generated by a laser 91b is used to illuminate a sample plane 19b, while another portion 83b" is directed onto a cathode 9b of a particle source 7b. The two partial beams 83b' and 83b' are split by a partially transparent mirror 103. The laser 91b is a pulsed laser, which generates laser pulses of a short time duration of, for example, a some femtoseconds. The particle source 7b is energized via contacts 10b and 13b such that it only emits a particle beam 15b when the laser beam 83b" is incident on the cathode 9b. The pulses of the laser beam 83b" trigger the emission of corresponding pulses of the particle beam 15b, which are incident on an object arranged in the sample plane 19b as pulses. The pulses incident on the sample trigger time-dependent processes and reactions within the sample. Such time-dependent processes can in turn be analyzed by the illumination light beam 83b' in a time-resolving manner. For this purpose, the illumination light beam 83b' is delayed via an optical delay 105 before it is incident on the sample plane 19b. The optical delay 105 is controlled by a controller of the system 1b, in order to vary an amount of the temporal delay introduced by the delay 105. Beam scanners 96b, 97b are provided to displace an incidence point 93b of the illumination light beam 83b on the sample plane 19b so that it coincides with an incidence point 25b of the particle beam 5b generated by the particle source 7b. Therefore, a pulse of the illumination light beam 83b' is incident on a point 93b, 25b, which has received a pulse of the particle beam 15b shortly beforehand. The pulse of the illumination light beam 83b' produces scattered light, which is supplied to a detector 50b via the light-optical lens 30b and further lenses 47b.

An intensity of the scattered light for a given incidence point 93b, 25b depends on a duration of time that has elapsed between the incidence of the pulse of the particle beam 15b and the incidence of the pulse of the illumination light beam 83b'. Phenomena induced in the object by the incidence of the pulses of the particle beam 15b can be analyzed in a time-resolved manner by varying this time period by changing the optical delay 105, accordingly.

In the embodiment shown in FIG. 3, the particle beam 15b intersects the optical axis 3b within a through hole 32b of the light-optical lens 30b, i.e. a plane 59b, in which the particle beam 15b intersects an optical axis 3b of the particle-optical beam path is arranged at a distance from both surfaces of the light-optical lens 30b which is smaller than a distance between the two lens surfaces.

The embodiment illustrated with reference to FIG. 3 differs from the previously illustrated embodiments in that a main plane 72b of the light-optical lens 30b is not arranged proximate to a back focal plane of the particle-optical lens 21b, but proximate to a main plane 73b of the particle-optical lens. In particular, a distance g between the main plane 73b of the particle-optical lens 21b and the main plane 72b of the light-optical lens 30b is smaller than 0.4 times the focal length of the particle-optical lens 21b.

It is to be noted that an arrangement such that the light-optical lens is arranged proximate to the main plane of the particle-optical lens can also be provided in the examples illustrated with reference to FIGS. 1 and 2.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. A combined inspection system comprising:
   a light-optical system configured to provide a light-optical beam path and comprising a light-optical lens arranged in the light-optical beam path, wherein the light-optical lens includes a first lens surface facing towards a sample plane, a second lens surface facing away from the sample plane and a through hole;
   a particle-optical system configured to provide a particle-optical beam path such that the particle-optical beam path traverses the through hole of the light-optical lens, wherein the particle-optical system comprises a beam deflection device configured to scan a primary particle beam over a portion of a sample plane; and
   a controller configured to control the beam deflection device such that the deflected primary particle beam intersects an optical axis of the particle-optical beam path in a plane arranged at a distance from both the first lens surface and the second lens surface which is smaller than 1.0 times a distance between the first lens surface and the second lens surface.

2. The inspection system according to claim 1, wherein the beam deflection device comprises two beam deflectors which are arranged upstream of the light-optical lens in the particle-optical beam path.

3. The inspection system according to claim 1, wherein the light-optical lens has a positive refractive power.

4. The inspection system according to claim 1, wherein the light-optical lens carries an electrically conductive coating on at least one of the first and second lens surfaces.

5. The inspection system according to claim 1, wherein the light-optical lens carries an electrically conductive coating on a surface of the through-hole.

6. The inspection system according to claim 5, wherein the electrically conductive coating is configured such that an electrical resistance between the first and second lens surfaces of the light-optical lens is less than one of 10MΩ, 1MΩ and 100kΩ.

7. The inspection system according to claim 1, wherein the light-optical system comprises at least one mirror arranged in the light-optical beam path, wherein the at least one mirror is configured to fold an optical axis of the light-optical beam path.

8. The inspection system according to claim 7, wherein the at least one mirror is arranged to deflect the optical axis of the light-optical beam path by an angle which is greater than 20°.

9. The inspection system according to claim 7, wherein the at least one mirror has a through hole, which is traversed by the particle-optical beam path.

10. The inspection system according to claim 7, wherein the mirror has a flat mirror surface.

11. The inspection system according to claim 7, wherein the mirror has a mirror surface made of metal.

12. The inspection system according to claim 1, wherein the light-optical lens comprises at least two lens elements manufactured from different materials that differ with respect to their refractive index.

13. The inspection system according to claim 1, wherein the particle-optical system comprises a magnetic lens including a first pole piece having a central bore, wherein the light-optical lens is mounted on the first pole piece.

14. The inspection system according to claim 13, wherein the light-optical lens comprises an electrically conductive coating electrically connected to the first pole piece.

15. The inspection system according to claim 13, wherein the magnetic lens includes a second pole piece having a central bore arranged at a smaller distance from the sample plane than the central bore of the first pole piece.

16. The inspection system according to claim 15, wherein the magnetic lens includes a coil arranged between the first and the second pole piece.

17. The inspection system according to claim 1, wherein the particle-optical system comprises a particle-optical lens and wherein the controller is configured to energize the particle-optical lens such that a distance between a rear focal plane of the particle-optical lens and a main plane of the light-optical lens is smaller than 0.4 times a focal length of the particle-optical lens.

18. The inspection system according to claim 1, wherein the particle-optical system comprises a particle-optical lens and wherein the controller is configured to energize the particle-optical lens such that a distance between a main plane of the particle-optical lens and a main plane of the light-optical lens is smaller than 0.4 times a focal length of the particle-optical lens.

19. The inspection system according to claim 1, wherein the particle-optical system comprises a particle beam source selected from a group consisting of an electron beam source and an ion beam source.

20. The inspection system according to claim 1, wherein the particle-optical system comprises a secondary particle detector.

21. The inspection system according to claim 20, wherein the secondary particle detector is one of a secondary electron detector and a back-scattered electron detector.

22. The inspection system according to claim 1, wherein the light-optical system comprises a light detector, which is arranged in the light-optical beam path, wherein the light-optical lens is arranged between the sample plane and the light detector in the light-optical beam path.

23. The inspection system according to claim 1, wherein the light-optical system comprises a light source configured to emit light directed to the sample plane.

24. The inspection system according to claim 1, wherein the light source comprises a laser configured to generate a laser light beam.

25. The inspection system according to claim 24, wherein the light-optical system comprises at least one beam deflector configured to scan the laser light beam over the sample plane.

26. The inspection system according to claim 24, wherein the laser is a pulsed laser configured to generate laser pulses.

27. The inspection system according to claim 26, further comprising a particle beam source and a beam splitter arranged in a beam path of the laser light beam, wherein a portion of the laser light beam is directed onto the particle beam source, in order to induce an emission of particles from the particle beam source.

28. The combined inspection system according to claim 27, further comprising an optical delay arranged in a beam path between the beam splitter and the sample plane or in a beam path between the beam splitter and the particle source.

* * * * *